(12) United States Patent
Lai et al.

(10) Patent No.: US 8,993,713 B1
(45) Date of Patent: Mar. 31, 2015

(54) SOLUTION PROCESSABLE N-TYPE LADDER POLYMER FOR HETERO-JUNCTION DEVICES

(71) Applicant: The United States of America as represented by the Secretary of the Navy, Washington, DC (US)

(72) Inventors: William W. Lai, Ridgecrest, CA (US); Alfred Baca, Ridgecrest, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 79 days.

(21) Appl. No.: 13/895,885

(22) Filed: May 16, 2013

Related U.S. Application Data

(60) Provisional application No. 61/647,653, filed on May 16, 2012.

(51) Int. Cl.
| | |
|---|---|
| *C08G 73/06* | (2006.01) |
| *H01L 51/42* | (2006.01) |
| *C08G 69/00* | (2006.01) |
| *H01L 51/00* | (2006.01) |
| *H01L 31/0256* | (2006.01) |

(52) U.S. Cl.
CPC ............. *H01L 51/424* (2013.01); *C08G 69/00* (2013.01); *H01L 51/0003* (2013.01); *H01L 51/0043* (2013.01); *H01L 2031/0344* (2013.01)
USPC ............... 528/423; 528/380; 528/370; 528/9; 528/377; 136/263; 526/256; 526/243; 257/40; 257/E51.025

(58) Field of Classification Search
USPC ............. 528/423, 77, 380, 370, 93; 136/263; 526/256, 243; 257/40, E51.025
See application file for complete search history.

(56) References Cited

U.S. PATENT DOCUMENTS

| | | | |
|---|---|---|---|
| 7,829,660 | B1 | 11/2010 | Stenger-Smith et al. |
| 8,427,812 | B1 | 4/2013 | Stenger-Smith et al. |
| 2008/0269485 | A1 * | 10/2008 | Moonen et al. ............... 544/245 |

OTHER PUBLICATIONS

U.S. Appl. No. 13/971,104, Lai, et al.
U.S. Appl. No. 14/023,219, Lai, et al.
U.S. Appl. No. 14/172,701, Harvey, et al.
U.S. Appl. No. 14/172,673, Harvey, et al.
U.S. Appl. No. 13/667,188, Roberts, et al.
U.S. Appl. No. 13/658,573, Roberts, et al.
U.S. Appl. No. 13/667,205, Roberts, et al.

* cited by examiner

*Primary Examiner* — Shane Fang
(74) *Attorney, Agent, or Firm* — Charlene A. Haley

(57) ABSTRACT

A n-type ladder copolymer including, a n-type ladder copolymer formed with alternating perylene and pyridine units having chemical structure A having two end groups, where perylene units having at least one solubilizing group attaching at position(s) 1, 6, 7, and/or 12, where $R_1$, $R_2$, $R_3$, and $R_4$ solubilizing group(s) are each independently selected from the group consisting of aryl, alkyl aryl, alkoxy aryl, and aryloxy aryl, and where n repeat units ranging from about 4 to about 400

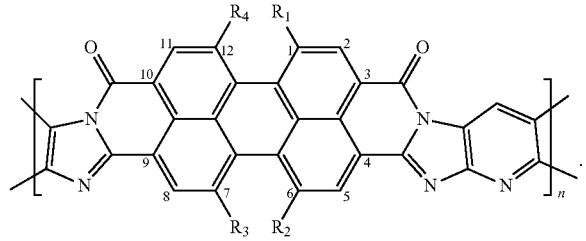

13 Claims, No Drawings

SOLUTION PROCESSABLE N-TYPE LADDER POLYMER FOR HETERO-JUNCTION DEVICES

CROSS-REFERENCE TO RELATED APPLICATIONS

This is a non-provisional patent application, claiming the benefit of, parent application Ser. No. 61/647,653 filed on May, 16, 2012, whereby the entire disclosure of which is incorporated hereby reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

Embodiments of the invention generally relate to soluble n-type ladder copolymers and making the same that are useful in electronic and photonic devices.

DETAILED DESCRIPTION OF THE EMBODIMENTS OF THE INVENTION

Organic polymers that have π-electron conjugated back bones are useful in electronic and photonic devices because their π-electrons and holes are relatively mobile and that is why they are called organic semiconductors. These polymers can also be 'doped' with a redox additive or electrodes that donate or withdraw electric charge to or from the polymer which can further enhance charge mobility/density and also fine-tune the optical or electrical bandgap and the stability of the polymer. An auxiliary group attached to the conjugated polymer backbone can also donate or withdraw electric charge to or from the conjugated backbone of the polymer, which imparts similar changes in charge mobility, bandgap and stability. In this case an electron-withdrawing group would make the polymer an 'n-type' polymer and an electron donating group would make the polymer a 'p-type' polymer.

n-Type organic materials generally have electron-withdrawing groups/components, such as carbonyl and sp2 nitrogen, such as azo and aromatic pyridine units. p-Type organic material generally have electron-donating groups/components, such as alkoxy, amine, thiophene units. An organic material that is an electronic or photonic 'heterojunction' material is a blend/mixture of an n-type material and a p-type material. Heterojunction polymers are useful in devices such as photovoltaic devices; organic solar cells; field-effect transistors; plastic solar cells; RFID) tags; and electronic sensors.

The difference in energy between the highest occupied molecular orbital (HOMO) and the lowest unoccupied molecular orbital (LUMO) of a ladder copolymer (or any polymer having a π-electron-conjugated backbone) is called the electronic bandgap of the material. The stability of n-type materials can be improved either by lowering the energy of lowest unoccupied molecular orbital (LUMO), raising the energy of highest occupied molecular orbital (HOMO) or a combination the two. A method to lower the energy level of LUMO with respect to the energy level of the HOMO is to introduce electron withdrawing elements. In U.S. Pat. No. 8,427,812 the use of a pyridine-based tetraamine instead of a benzene-based tetraamine as comonomer in a Poly[7-oxo-7H-benz(d,e)imidazo(4',5':5,6)-benzimidazo(2,1-a) isoquinoline-3,4:10,11-tetrayl)-10 carbonyl (BBL)-type ladder polymer has been shown to lower the energy of the LUMO by about 0.5 eV. U.S. Pat. No. 8,427,812 describes the stability improvements when using thin film BBL ladder polymers based on tetramino pyridine as the cathode material at a working voltages of >2.0 volts.

The term 'ladder' polymer generally refers to polymers that have a two-dimensional ribbon-like backbone comprised of covalent bonds running the full length of the backbone, like the sides of a ladder, the rungs of the ladder being part of the fused rings. The limited conformational freedom of π-electron conjugated ladder polymers is responsible for the high electron delocalization and high electron mobility in n-type polymers such as Poly(7-oxo-7H-benz(d,e)imidazo(4',5':5,6)-benzimidazo(2,1-a)isoquinoline-3,4; 10,11-tetrayl)-10 carbonyl (BBL), in contrast to conventional conjugated polymers in which have only a one-dimensional backbone of covalent bonds. BBL would have useful electronic, photonic and optoelectronic properties; however, BBL can only be processed in strong Bronsted acids, such as methanesulfonic acid or strong Lewis acids such as gallium trichloride.

Aromatic heterocyclic ladder polymers are also attractive for high temperature applications, however, their limited solubility makes their fabrication very difficult. Furthermore, strong acidic solvents are very corrosive to any substrate touching the polymer. A BBL coating on metals would be impossible due to the corrosive nature of the acidic solvents. This would preclude the use of BBL-type ladder polymers in many types of useful devices, such as photovoltaic devices.

It is to be understood that the foregoing are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

Embodiments of the invention generally relate to a soluble n-type ladder copolymer and its use in heterojunction materials, heterojunction devices, and other electronic and photonic devices.

Although embodiments of the invention are described in considerable detail, including references to certain versions thereof, other versions are possible. Therefore, the spirit and scope of the appended claims should not be limited to the description of versions included herein.

Embodiments of the invention include a new class of ladder polymers formed with tetracarbonyl perylene having solubilizing substituents and tetramino pyridine as the repeat unit. The tetracarbonyl perylene (which is the first unit in the ladder-polymer backbone) is functionalized with solubilizing groups on the 1, 6, 7, and/or 12 positions of the aromatic perylene molecular framework. 2,3,5,6-Tetramino pyridine is the second unit in the ladder-polymer backbone. The pyridine unit enhances the n-type nature of the polymer, which increases its electro-chemical stability and increases its thermal stability in air. The general structure of the ladder polymers of the invention is shown in Scheme 1. The 'n' is the number of perylene-pyridine repeat units in the polymer backbone, and $R_5$, $R_6$, $R_7$, and $R_8$ can be aryl, alkyl aryl, alkoxy aryl, and aryloxy aryl.

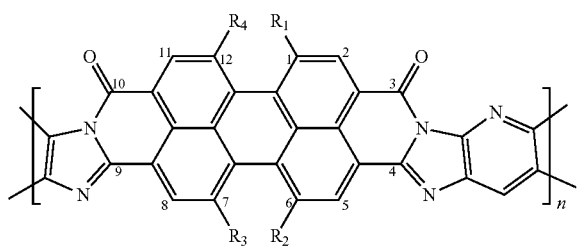

Scheme 1.

General structure of the perylene-pyridine ladder polymer embodiment having solubilizing groups at position(s) 1, 6, 7, and/or 12.

End groups, as an embodiment of the invention, may be placed on the polymer to further enhance solubility and stability. The precursors to the end groups (essentially monofunctional monomers) are added with the repeating monomers to the polymerization vessel and become attached at the chain ends. These mono-functional end-capping compounds are also used to control the molecular weight of the copolymer. They normally are added to the polymerizaation vessel at $1/10^{th}$ to $1/100^{th}$ part per part of the other difunctional monomers (moles per mole). Examples of such end-capping groups (precursors to the copolymer end groups) are shown in Scheme 2. The solubilizing groups on the end groups are chosen from the same solubilizing groups that are attached to the perylene units, namely, aryl, alkyl aryl, alkoxy aryl, and aryloxy aryl.

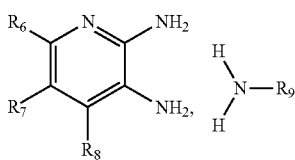

Scheme 2.

Examples end-capping compounds (precursors to the copolymer end groups), where $R_5$, $R_6$, $R_7$, and $R_9$ can be aryl, alkyl aryl, alkoxy aryl, and aryloxy aryl.

A heterojunction material having the soluble n-type ladder copolymer(s) is also an embodiment of the invention. The heterojunction material also has a soluble p-type organic material, including polythiophene, poly(3-alkylothiphene), poly(3-arylthiophene), poly(3,4-alkoxythiophene), poly(phenylene-co-vinylenc), poly(methylethylhexylphenylene-co-vinylene), other substituted poly(phenylene-co-vinylene)s, and other p-type organic polymers. The normal ratio of the n-type and the p-type components of the heterojunction material is one part by weight of the p-type material and one-quarter to two parts by weight of the soluble n-type ladder copolymer.

A photonic and/or electronic device including the heterojunction material having the soluble n-type ladder copolymer component, including a heterojunction photovoltaic cell, is an embodiment of the invention. The heterojunction material in the device may, for example, be a film, or layer, or an array of quantum dots, and will have at least one dimension in the range of about 10 to about 1000 nanometers. The surface of the heterojunction material may be embossed and/or nano-imprinted with nano-features, including pillars and/or wells. An example of a typical fabrication method is given below.

The preparation of the monomers that are used in the condensation polymerization to form the repeat units in the copolymer of the invention are described in Examples 1-10.

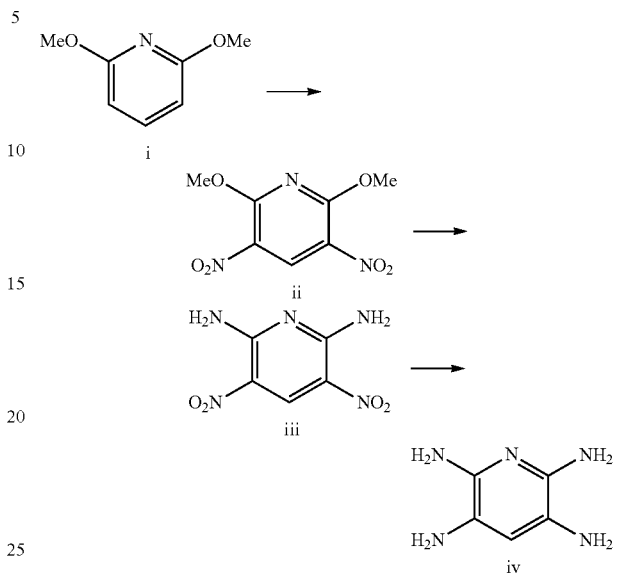

Scheme 3.

Preparation of 2,3,5,6-tetramino pyridine.

Example 1

Preparation of 2,6-dimethoxy 3,5-dinitro pyrazine (Scheme 3, Compound ii)

2,6-Dimethoxy pyrazine (40.0 g, 0.29 mol) was slowly added to a 0° C. solution of fuming nitric and fuming sulfuric acid (160 mL: 240 mL). The reaction was allowed to stir for 30 minutes at 0° C. and then allowed to warm to room temperature and stirred for an additional 3 hours. The reaction mixture was poured onto ice (1000 cc) and stirred for 30 minutes. The pale yellow precipitation (33.4 g, 50.8%) was collected, washed with water, air dried and used in next step without further purification.

Example 2

Preparation of 2,6-diamino 3,5-dinitro pyrazine (Scheme 3, Compound iii)

Ammonium hydroxide (28%, 60 mL) was added drop wise to a slurry of 2,6-dimethoxy 3,5-dinitro pyrazine (10.0 g, 43.5 mmol) in acetonitrile (50 mL). Upon addition, the yellow slurry became red/yellow in color and eventually became a red solution. As the solution was heated at 65° C. for an hour, yellow precipitate (8.0 g, 92.2%) began to form, which was filtered hot and allowed to air dry.

Example 3

Preparation of 2,3,5,6-tetramino pyrazine (Scheme 3. Compound iv)

2,6-Diamino 3,5-dinitro pyrazine (150 g, 75 mmol), 5% palladium on carbon (2.0 g) and deoxygenated water (200 mL) was added to a parr shaker and charged with 50 psi of hydrogen and allowed to shake at room temperature tor 24 hours. The reaction mixture was added to deoxygenated boiling water (750 mL) and filtered hot. The filtrate was allowed to cool to room temperature and the resulting solid was recrystallized from concentrated HCl (16.1 g, 80.1%). Crystal exists as a trihydrogen chloride mono hydrate system.

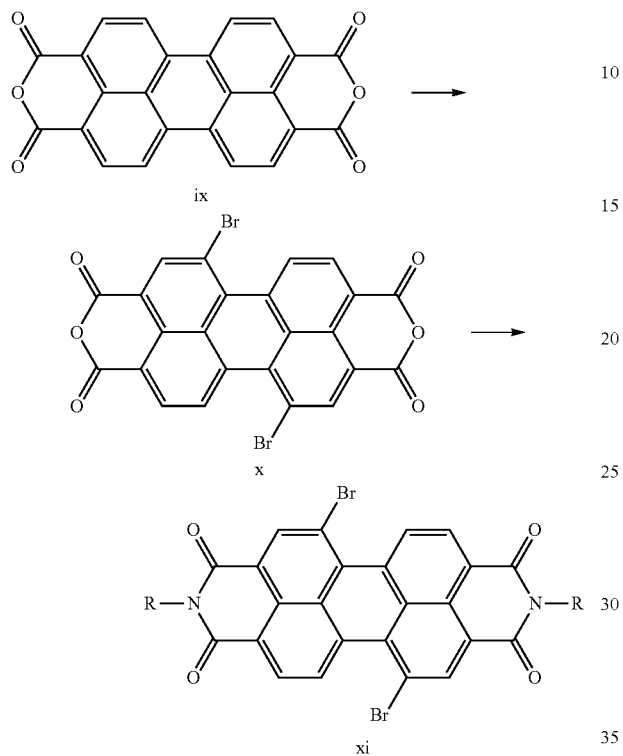

Scheme 4.
Preparation of 2,7-dibromoperylene-3,4,9,10-tetracarboxylic acid dianhydride (x) and diimide (xi).

Example 4

Preparation of 2,7-dibromoperylene-perylene 3,4,9,10-tetracarboxylic acid dianhydride (Scheme 4, Compound x)

Compound ix (100 g, 254.9 mmol) was added to sulfuric acid (800 mL) and allowed to stir at 60° C. for 2 days. Iodine (3 g, 11.8 mol) was added and stirred for 5 hours and then bromine (200 g, 1.25 mol) was added dropwise. The heat was increased to 80 C. and the reaction was heated for another 2 days. The reaction mixture was allowed to cool to room temperature and poured into ice water (1 L). The red precipitate was collected, dried and used in the next step without further purification.

Example 5

Preparation of N,N'-Di(2-ethylhexyl)-1,7-dibromoperylene-3,4,9,10-tetracarboxylic acid diimide (Scheme 4, Compound xi)

A flask was charged with 2,7-dibromoperylene-3,4,9,10-tetracarboxylic acid dianhydride (6.13 g, 11.1 mmol) (Compound x). 2-ethylhexylamine (4.5 mL, 30 mmol), 1-methyl-2-pyrrolidinone (50 mL) and acetic acid (3.5 mL). The suspension was heated at 100° C. for 2 days then poured into 1 M HCl (200 mL). The red precipitate was isolated by filtration then washed with water and methanol. The product was purified by column chromatography on silica gel (eluent: 70-80% dichloromethane in hexanes). The red solid was then dissolved in 50 mL of toluene. This solution was exposed to the vapor of hexanes over 14 days, resulting in the crystallization of the product as a red powder.

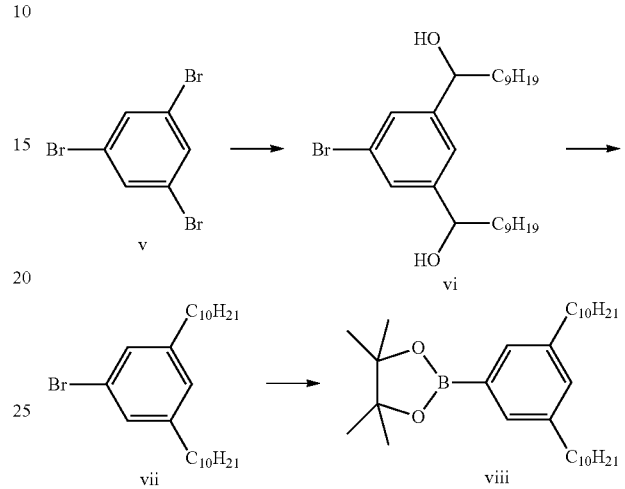

Scheme 5.
Preparation of a solubilizing group to be attached to the perylene units.

Example 6

Preparation of 1-bromo-3,5-di(1-hydroxydecyl)benzene (Compounds vi in Scheme 5)

A flask containing 1,3,5-tribromobenzene (4.61 g, 14.6 mmol). Compound v and diethyl ether (150 mL) was cooled to −78° C. To this was added a solution of tert-butyllithium in pentane (35.2 mL, 1.7 M) dropwise by syringe over 15 min. The solution changed from clear to orange. After stirring at −78° C. for 30 min. 1-decanal (6.03 mL, 32.1 mmol) was added dropwise by syringe over 10 min. After warming to room temperature, dilute aqueous ammonium chloride (150 mL) was added. The layers were separated, and the aqueous layer was extracted with diethyl ether (100 mL) and ethyl acetate (100 mL). The combined organics were washed with brine (100 mL) and dried over sodium sulfate. The solvent was removed at reduced pressure yielding a white solid. This product was purified by column chromatography on silica gel (eluent: 15-25% ethyl acetate in hexanes) yielding 5.1 g of white solid (Compound vi in 74% yield).

Example 7

Preparation of 1-bromo-3,5-didecylbenzene, Compound vii, Scheme 5

A flask was charged with Compound vi (1.50 g, 3.19 mmol), triethylsilane (3.6 mL, 22 mmol), and dichloromethane (14 mL). The solution was cooled to 0° C., then boron trifluoride diethyl etherate (2.8 mL, 22 mmol) was added dropwise by syringe. The solution was allowed to slowly warm to room temperature while stirring for 1 day.

Potassium bicarbonate (1 M) was then added with vigorous stirring until the solution turned basic. This solution was extracted with dichloromethane (2×200 mL). The organics were dried with sodium sulfate then concentrated and dried to yield 1.28 g of light orange oil (92% yield).

Example 8

Preparation of Pinacol Boronate (Compound viii. Scheme 5)

A flask containing vii (1.07 g, 2.45 mmol) and THF (15 mL) was cooled to −78° C. To this solution was added tert-butyllithium in pentane (3.2 mL, 1.7 M) dropwise by syringe over 10 min. After stirring for 20 min at −78° C., 2-isopropoxy-4,4,5,5-tetrametramethyl-1,2,3-dioxaborane (0.65 mL, 3.2 mmol) was added by syringe over 3 min. After stirring for 25 min, the solution was warmed to room temperature and quenched by addition of dilute aqueous ammonium chloride (50 mL). This solution was extracted with ethyl acetate (3×60 mL). The organics were dried over sodium sulfate and concentrated under reduced pressure. Drying under vacuum yielded 120 g of clear oil (100% yield).

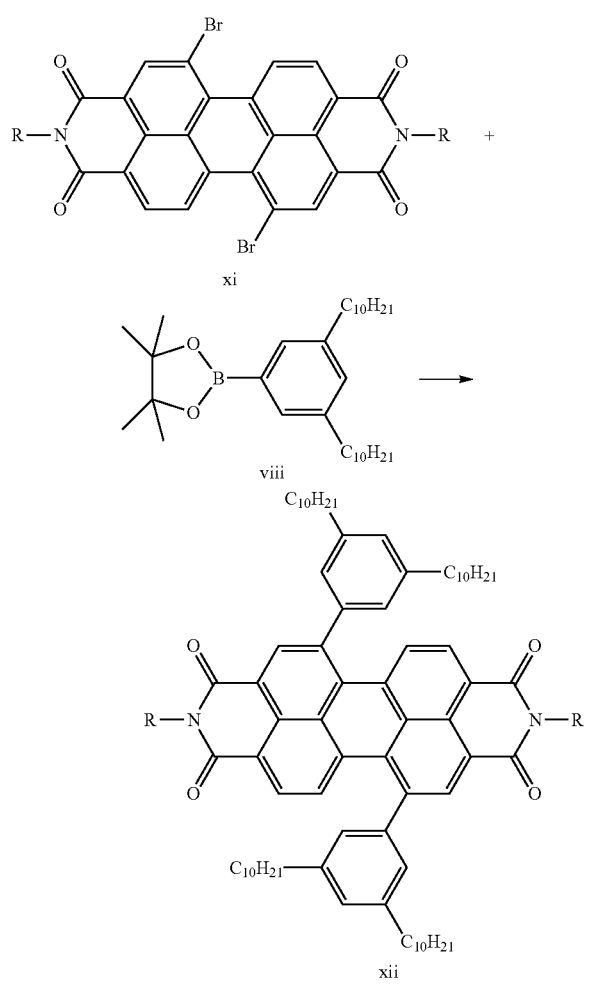

Scheme 6.
Coupling of solubilizing groups to perylene core to form the soluble perylene diimide (PDI) precursor to the dianydride monomer.

Example 9

Preparation of Solubilized Perylene Diimide (PDI) (Scheme 6, Compound xii)

PDI-$Br_2$ (Compound xi) (1.0 g, 1.29 mmol), dialkyl benzo dioxoborane (1.39 g, 2.85 mmol) (Compound viii), Pd$(PPh_3)_4$, (0.15 g, 0.13 mmol) and 2 M $K_2CO_3$ aqueous solution (5 mL) in THF (30 mL) was refluxed for 24 hours. After cooling the solution, water (20 mL) and brine was added. The organic layer was separated and dried over $MgSO_4$. The solvent was removed under reduced pressure and the desired product (0.37 g, 21.6%) was obtained by column chromatography (35% dichloromethane in hexanes).

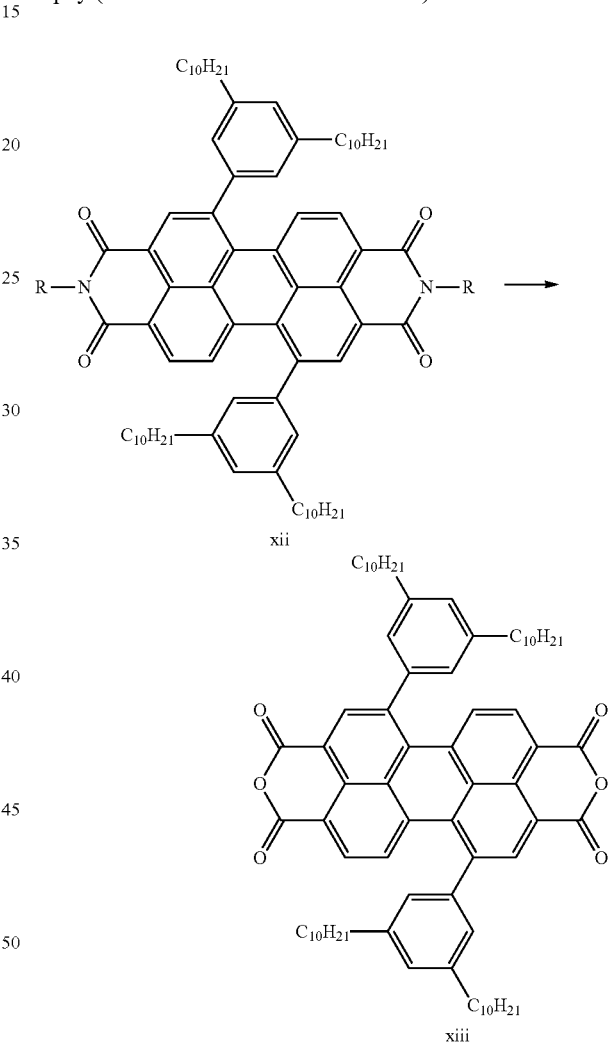

Scheme 7.
Synthesis of the soluble perylene dianhydride monomer from the diimide.

Example 10

Preparation of Soluble Perylene Dianhydride (Scheme 7, Compound xiii)

A flask was charged with Compound xiii (1.0 g, 0.75 mmol), potassium hydroxide (4.5 g, 80 mmol), and isopropanol (25 mL). The reaction was refluxed tor 2 hours, then poured into 0.3 M acetic acid (500 mL) and extracted with hexanes (3×75 mL). The combined organic fractions were dried over sodium sulfate and solvent was removed under reduced pressure. The product was purified by column chromatography on silica gel (eluent: 5-10% ethyl acetate and 0.5% acetic acid in hexanes) yielding 423 mg of dark purple solid (50.7% yield).

These are prophetic examples:

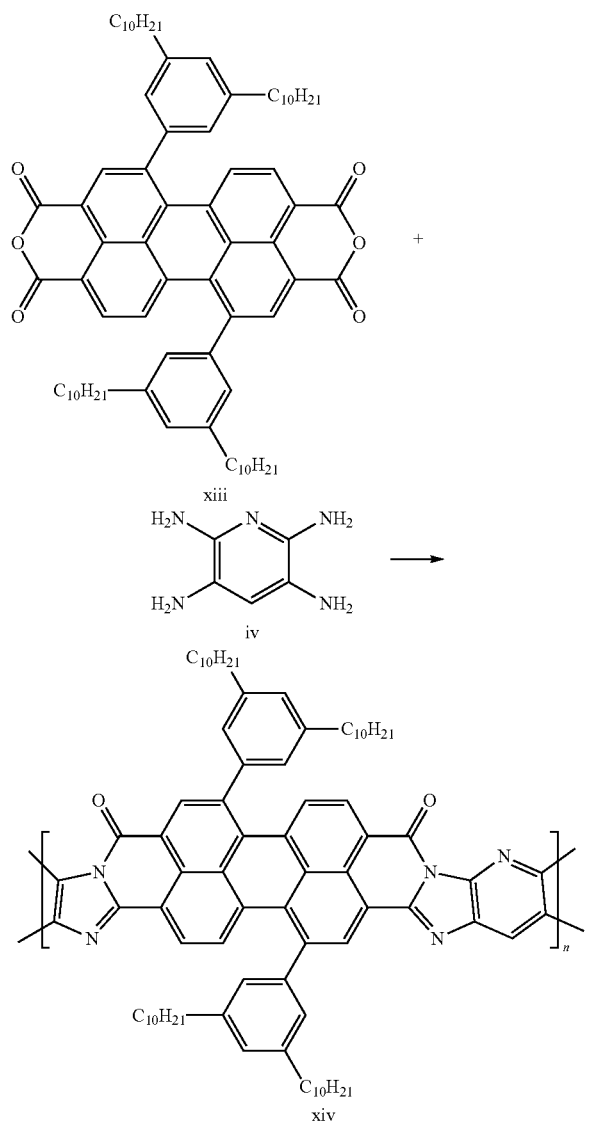

Scheme 8.
Condensation of the tetraamine and perylene monomers forming the novel perylene polymer.

Example 11

Preparation of Perylene Tetra Amino Pyridine Polymer (Scheme 8, Copolymer xiv)

Tetramino pyridine (Scheme 1, Compound Iv) is added to polyphosphoric acid under a nitrogen blanket. The mixture is heated to 120° C. and vacuum is applied to the reaction. When the reaction ceases to bubble, the soluble PDI monomer (Scheme 8, Compound xiii) is added and the reaction is allowed to stir for day. The temperature is raised to 180° C. and allowed to stir or another 2 days. The temperature is then raised to 225° C. and stirred for 4 hours. The reaction is allowed to cool to 100° C. and poured into water. The precipitate is collected, washed with methanol and dried.

Example 12

Fabrication of a heterojunction material and a heterojunction photovoltaic cell (device). Organic photovoltaic (PV) devices are composed of substrate, a blend (1:1 is usually an optimal concentration) of organic acceptor and donor semiconducting materials, cathode and anode metal contacts. The device is formed on a substrate which can be composed of silicon, Ge, Quartz wafers, glass, plastic materials including polyethylene, and or elastomeric substrate including polydimethylsiloxanes. A cathode electrode is deposited on the substrate. The cathode material is composed of highly conductive metals, including Au, Ag, and Al, and/or metal oxides including indium tin oxide (ITO). ZnO, and zinc indium tin oxide (ZITO). A blend of electron acceptor materials including polythiophene. MEH-PPV and other p-type organic polymers and solution processable ladder copolymer(s) of the invention (e.g. Copolymer xiv of Scheme 8). Deposition of a thin, electrically conductive film, a metal or metal alloy including Ag, Au, and Al, Pt, and/or metal oxide including ITO, ZnO, and ZITO completes the device fabrication. For the nano-imprint and/or nano-embossing embodiment, the blended layer (the heterojunction having electron acceptor and donor materials) is imprinted with nanoscale features prior to the deposition of the top metal layer.

Embodiments of the invention generally relate to n-type ladder copolymers including, a n-type ladder copolymer formed with alternating perylene and pyridine units having chemical structure A having two end groups.

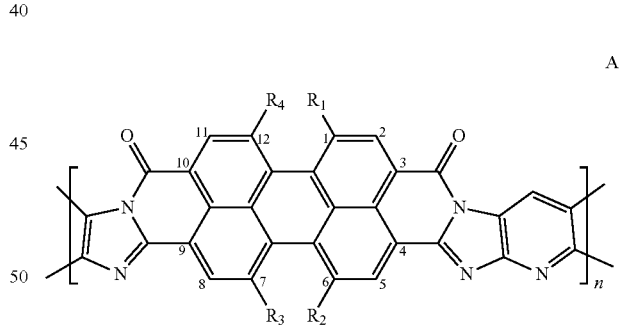

A where the perylene units having at least one solubilizing group attaching at position(s) 1, 6, 7, and/or 12, where the $R_1$, $R_2$, $R_3$, and $R_4$ solubilizing group(s) are each independently selected from the group consisting of aryl, alkyl aryl, alkoxy aryl, and aryloxy aryl, and where n repeat units ranging from about 4 to about 400. Another aspect of the invention generally relates to organic heterojunction layer including, an organic heterojunction blend having at least one solution-processable p-type organic material and at least one solution-processable n-type ladder copolymer, where the copolymer formed with alternating perylene and pyridine units and having chemical structure D.

D

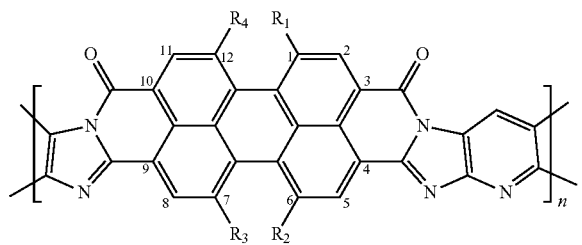

where the perylene units having at least one solubilizing group attaching at position(s) 1, 6, 7, and/or 12, where at least one of the $R_1$, $R_2$, $R_3$, and $R_4$ solubilizing group(s) are each independently selected from the group consisting of aryl, alkyl aryl, alkoxy aryl, and aryloxy aryl, and where n repeat units ranging from about 4 to about 400.

Yet another aspect of the invention generally relates to liquid pre-cursor solutions including, at least one solvent and n-type ladder copolymer(s), where the copolymer formed with alternating perylene and pyridine units having chemical structure E,

E

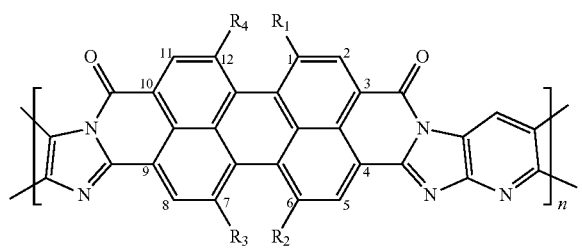

where the perylene units having at least one solubilizing group attaching at position(s) 1, 6, 7, and/or 12, where the $R_1$, $R_2$, $R_3$, and $R_4$ solubilizing group(s) are each independently selected from the group consisting of aryl, alkyl aryl, alkoxy aryl, and aryloxy aryl, where n repeat units ranging from about 4 to about 400, and where the solvent(s) selected from the group consisting of toluene, xylene, other aromatic hydrocarbons, anisole, veritrol, other aryl ethers, dimethylformamide, n-methylpyrrolidinone, dimethylacetamide, chlorobenzene, dichlorobenzene, other halogenated aromatic hydrocarbons, halogenated aliphatic hydrocarbons, and other common organic solvents.

Still yet in other aspects the invention generally relates to methods of firming an organic heterojunction film including, providing a liquid solution having at least one solvent, at least one p-type organic material, and at least one n-type ladder copolymer, where the copolymer is formed with alternating perylene and pyridine units having chemical structure F,

F

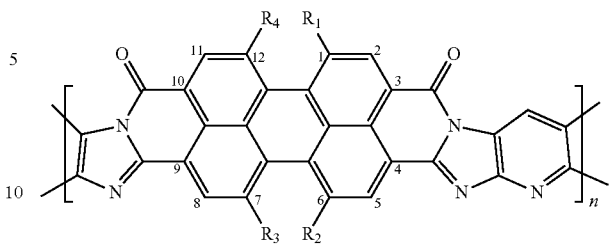

where the perylene units having at least one solubilizing group attaching at position(s) 1, 6, 7, and/or 12, where the $R_1$, $R_2$, $R_3$, and $R_4$ solubilizing group(s) are each independently selected from the group consisting of aryl, alkyl aryl, alkoxy aryl, and aryloxy aryl, where n repeat units ranging from 4 to 400, casting the solution on a suitable substrate providing at least one solvent-swollen film, and removing the residual solvent from the solvent-swollen film with vacuum and/or heat producing at least one the heterojunction film.

Embodiments of the invention further include fabricating a photovoltaic device by providing a suitable substrate selected from the group consisting of silicon, germanium, quartz, glass, polyethylene, polyethylene terephthalate, polydimethylsiloxane, other plastic materials, and other elastomeric materials, depositing on the substrate a first electrode selected from the group consisting of gold, silver, aluminum, other conductive metals, indium-tin-oxide, and other conductive metal oxides materials depositing on the first electrode a liquid solution, casting the solution producing at least one solvent-swollen film, removing the residual solvent from the solvent-swollen film with vacuum and/or heat producing organic heterojunction film, nano-imprinting and/or embossing pillars and/or wells on and/or in the heterojunction film, and depositing on the imprinted and/or embossed heterojunction film second electrode selected from the group consisting of gold, silver, aluminum, other conductive metals, indium-tin-oxide, and other conductive metal oxides materials producing the photovoltaic device.

Embodiments of the invention include the end groups of base formula B and/or C,

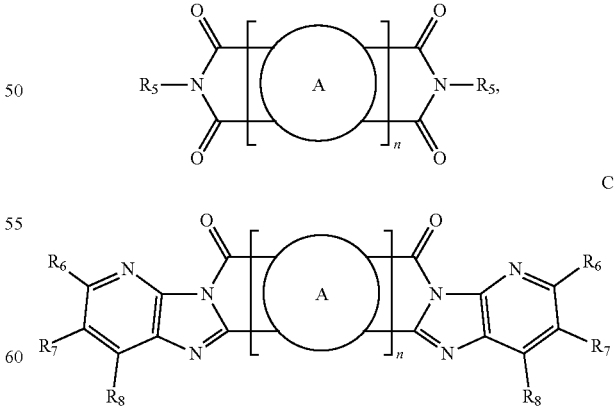

where $R_5$, $R_6$, $R_7$, and $R_8$ are each independently selected from the group consisting of aryl, alkyl aryl, alkoxy aryl, and aryloxy aryl. In other embodiments, the end groups of base formula H and/or I.

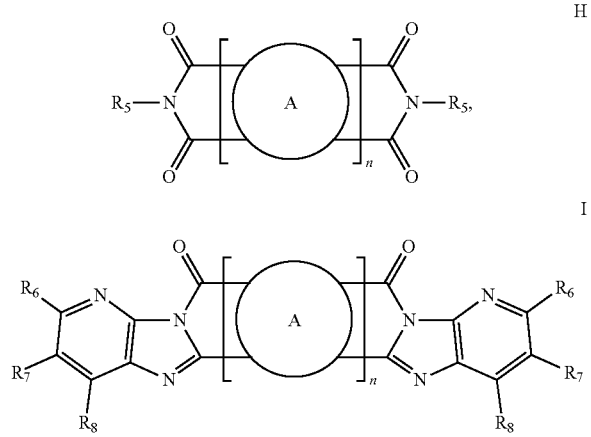

where $R_5$, $R_6$, $R_7$, and $R_8$ are each independently selected from the group consisting of aryl, alkyl aryl, alkoxy aryl, and aryloxy aryl.

In embodiments, the p-type material selected from the group consisting of polythiophene, poly(3-alkylothiphene), poly(3-arylthiophene), poly(3,4-alkoxythiophene), poly(phenyeyene-co-vinylene, poly(methylethylhexylphenylene-co-vinylene), other substituted poly(phenylene-co-vinylene)s, and other p-type organic polymers. In other embodiments, the composition includes one part by weight the material and one-quarter to two parts by weight the copolymer. In other embodiments, the composition has at least one dimension in the range of about 10 to about 1000 nanometers. In embodiments, the layer having surface embossed and/or nano-imprinted pillars and/or wells.

Another aspect of the invention generally relates to photonic, electronic, photovoltaic, energy detecting, energy harvesting, or solar energy collecting device(s) having the copolymer and/or composition described herein.

Examples are for illustration purposes only and not to be used to limit any of the embodiments. Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A n-type ladder copolymer, comprising:
   a n-type ladder copolymer formed with alternating perylene and pyridine units having chemical structure A having two end groups;

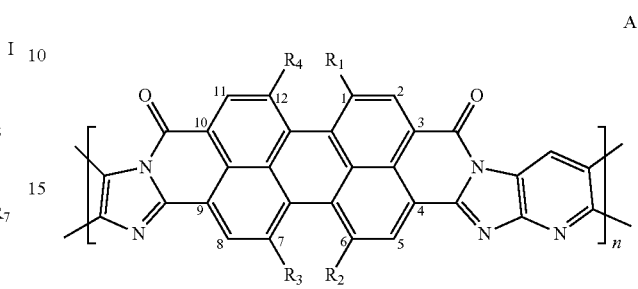

wherein said perylene units having at least one solubilizing group attaching at position(s) 1, 6, 7, and/or 12;

wherein said $R_1$, $R_2$, $R_3$, and $R_4$ solubilizing group(s) are each independently selected from the group consisting of aryl, alkyl aryl, alkoxy aryl, and aryloxy aryl; and wherein n repeat units ranging from about 4 to about 400.

2. The copolymer according to claim 1, wherein said end groups of base formula B and/or C;

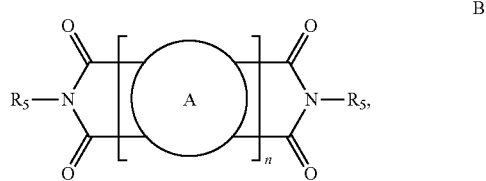

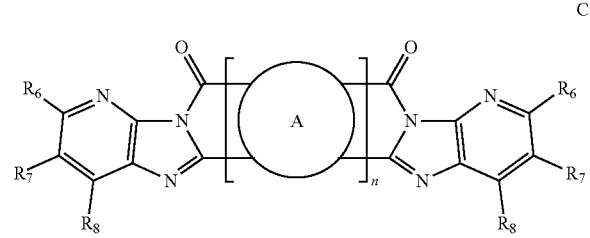

wherein $R_5$, $R_6$, $R_7$, and $R_8$ are each independently selected from the group consisting of aryl, alkyl aryl, alkoxy aryl, and aryloxy aryl.

3. An organic heterojunction layer, comprising:
   an organic heterojunction blend having at least one solution-processible p-type organic material and at least one solution-processible n-type ladder copolymer;

wherein said copolymer formed with alternating perylene and pyridine units and having chemical structure D;

D

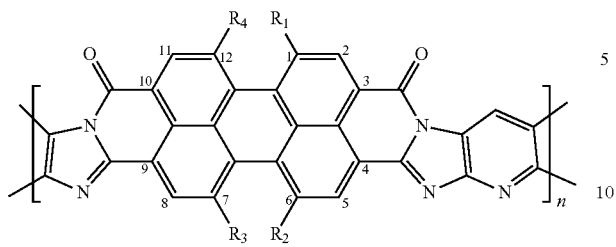

wherein said perylene units having at least one solubilizing group attaching at position(s) 1, 6, 7, and/or 12;
wherein at least one of said $R_1$, $R_2$, $R_3$, and $R_4$ solubilizing group(s) are each independently selected from the group consisting of aryl, alkyl aryl, alkoxy aryl, and aryloxy aryl; and
wherein n repeat units ranging from about 4 to about 400.

4. The composition according to claim 3, wherein said end groups of base formula H and/or I;

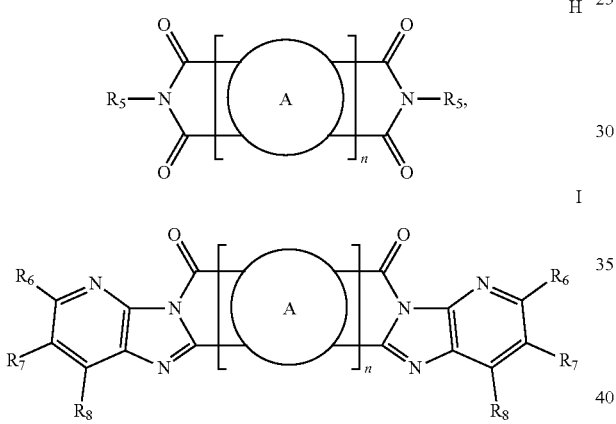

wherein $R_5$, $R_6$, $R_7$, and $R_8$ are each independently selected from the group consisting of aryl, alkyl aryl, alkoxy aryl, and aryloxy aryl.

5. The composition according to claim 3, wherein said p-type material selected from the group consisting of polythiophene, poly(3-alkylothiphene), poly(3-arylthiophene), poly(3,4-alkoxythiophene), poly(phenylene-co-vinylene), poly(methylethylhexylphenylene-co-vinylene), other substituted poly(phenylene-co-vinylene)s, and other p-type organic polymers.

6. The composition according to claim 3, wherein said composition comprises one part by weight said material and one-quarter to two parts by weight said copolymer.

7. The composition according to claim 3, wherein said composition having at least one dimension in the range of about 10 to about 1000 nanometers.

8. The composition according to claim 3, wherein said layer having surface embossed and/or nano-imprinted pillars and/or wells.

9. Photonic, electronic, photovoltaic, energy detecting, energy harvesting, or solar energy collecting device(s) having said copolymer of claim 1.

10. Photonic, electronic, photovoltaic, energy detecting, energy harvesting, or solar energy collecting device(s) having said layer of claim 3.

11. A liquid pre-cursor solution, comprising:
at least one solvent and n-type ladder copolymer(s);
wherein said copolymer formed with alternating perylene and pyridine units having chemical structure E;

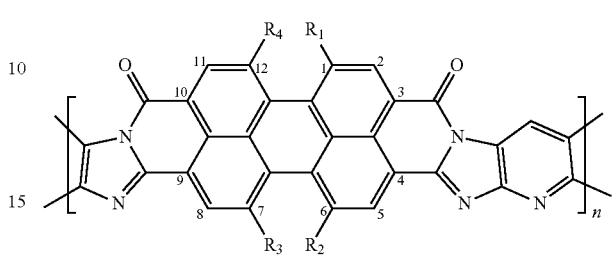

wherein said perylene units having at least one solubilizing group attaching at position(s) 1, 6, 7, and/or 12;
wherein said $R_1$, $R_2$, $R_3$, and $R_4$ solubilizing group(s) are each independently selected from the group consisting of aryl, alkyl aryl, alkoxy aryl, and aryloxy aryl;
wherein n repeat units ranging from about 4 to about 400; and
wherein said solvent(s) selected from the group consisting of toluene, xylene, other aromatic hydrocarbons, anisole, veritrol, other aryl ethers, dimethylformamide, n-methyl pyrrolidinone, dimethylacetamide, chlorobenzene, dichlorobenzene, other halogenated aromatic hydrocarbons, halogenated aliphatic hydrocarbons, and other common organic solvents.

12. A method of forming an organic heterojunction film, comprising:
providing a liquid solution having at least one solvent, at least one p-type organic material, and at least one n-type ladder copolymer, wherein said copolymer is formed with alternating perylene and pyridine units having chemical structure F;

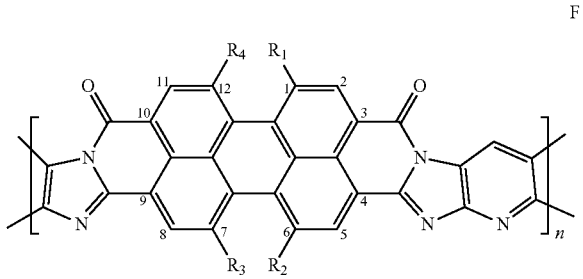

wherein said perylene units having at least one solubilizing group attaching at position(s) 1, 6, 7, and/or 12;
wherein said $R_1$, $R_2$, $R_3$, and $R_4$ solubilizing group(s) are each independently selected from the group consisting of aryl, alkyl aryl, alkoxy aryl, and aryloxy aryl;
wherein n repeat units ranging from 4 to 400;
casting said solution on a suitable substrate providing at least one solvent-swollen film; and
removing said residual solvent from said solvent-swollen film with vacuum and/or heat producing at least one said heterojunction film.

13. The method according to claim 12, further comprising fabricating a photovoltaic device by providing a suitable substrate selected from the group consisting of silicon, germanium, quartz, glass, polyethylene, polyethylene terephthalate, polydimethylsiloxane, other plastic materials, and other elastomeric materials;

depositing on said substrate a first electrode selected from the group consisting of gold, silver, aluminum, other conductive metals, indium-tin-oxide, and other conductive metal oxides materials;

depositing on said first electrode a liquid solution;

casting said solution producing at least one solvent-swollen film;

removing said residual solvent from said solvent-swollen film with vacuum and/or heat producing organic heterojunction film;

nano-imprinting and/or embossing pillars and/or wells on and/or in said heterojunction film; and depositing on said imprinted and/or embossed heterojunction film second electrode selected from the group consisting of gold, silver, aluminum, other conductive metals, indium-tin-oxide, and other conductive metal oxides materials producing said photovoltaic device.

* * * * *